United States Patent [19]

Cavallotti et al.

[11] Patent Number: 5,103,416
[45] Date of Patent: Apr. 7, 1992

[54] PROGRAMMABLE DIGITAL FILTER

[75] Inventors: Franco Cavallotti, Turin; Alessandro Cremonesi, Angelo Lodigiano; Rinaldo Poluzzi, Milan, all of Italy

[73] Assignee: SGS-Thomson Microelectronics S.r.l., Agrate Brianza, Italy

[21] Appl. No.: 439,792

[22] Filed: Nov. 21, 1989

[30] Foreign Application Priority Data

Dec. 6, 1988 [IT] Italy ............... 22890 A/88

[51] Int. Cl.$^5$ ............................................... G06F 15/31
[52] U.S. Cl. ..................................................... 364/724.16
[58] Field of Search ........................ 364/724.01, 724.16

[56] References Cited

U.S. PATENT DOCUMENTS

| | | | |
|---|---|---|---|
| 3,777,130 | 12/1973 | Croisier et al | 364/724.16 |
| 4,423,488 | 12/1983 | Campbell | 364/724.16 X |
| 4,450,533 | 5/1984 | Petit et al. | 364/724.13 |
| 4,701,956 | 10/1987 | Katoh | 364/724.13 X |
| 4,709,343 | 11/1987 | Van Cang | 364/724.01 |
| 4,766,563 | 8/1988 | Fujimoto | 364/724.16 |
| 4,794,555 | 12/1988 | Kojima et al. | 364/724.01 |
| 4,811,262 | 3/1989 | White | 364/724.01 |

OTHER PUBLICATIONS

Schröder, "High Word-Rate Digital Filters with Programmable Table Look-up," IEEE Trans. on Circuits & Systems, vol. CAS-24, No. 5, May 1977, pp. 277-279.

Primary Examiner—Gary V. Harkcom
Assistant Examiner—Tan V. Mai
Attorney, Agent, or Firm—Wolf, Greenfield & Sacks

[57] ABSTRACT

The digital filter includes a plurality of parallel adders, each whereof has a first input, a second input and an output; the parallel output of each adder is connected to the first input of the successive adder across a respective delay element. The second input of each adder is connected in parallel to the output of one of a plurality of memory banks, each whereof comprises a plurality of addressable memory cells, the addressing inputs whereof can be driven by a sampled digital signal to be filtered, and the memory cells of each bank contain a digital value which is equal to the product of a preset coefficient by the address of the cell itself.

11 Claims, 3 Drawing Sheets

PROGRAMMABLE DIGITAL FILTER

BACKGROUND OF THE INVENTION

The present invention relates to a programmable digital filter for wide-band electronic signals, and more particularly the invention relates to a non-recursive digital filter with finite impulse response (FIR) for a wide range of applications.

PRIOR ART

As is known, known digital filters are based on one of two possible approaches in order to execute the required arithmetical operations of multiplication and addition: one uses conventional processors operating in time-division, the other uses dedicated parallel structures in "wired" or "hardware" form.

Of these two approaches, the first leads to slower filters, which therefore have a low upper limit frequency, but even commercial filters based on dedicated structures still have considerable limitations in processing speed, in the number of taps and in the scarce ability to adapt to changes in the surrounding system conditions.

SUMMARY OF THE INVENTION

The aim of the invention is therefore to provide a programmable digital filter of the above described kind, which can be implemented as an integrated circuit and offers higher speed and precision performance than known digital filters of equivalent complexity and has a simple and uniform circuital structure, so that it can be easily implemented as VLSI integrated circuit.

Another object is to provide said filter with a reprogrammable architecture in order to obtain different responses and functionalities, and which allows in particular to provide half-band filters, symmetrical or asymmetrical filters, of the even or odd type and with or without central coefficient, by means of simple programming, with a minimum silicon area occupation.

This aim, this object and other advantages which will become apparent from the continuation of the description are achieved by the invention with a programmable digital filter which comprises a plurality of parallel adders, each whereof has a first input, a second input and an output, the parallel output of each adder being connected to the first input of the successive adder across a respective delay element, characterized in that the second input of each adder is connected in parallel to the output of one of a plurality of memory banks, each of which comprises a plurality of addressable memory cells, the addressing inputs whereof can be driven by a sampled digital signal to be filtered, and in that the memory cells of each bank contain a digital value which is equal to the product of a preset coefficient and of the address of said cell.

BRIEF DESCRIPTION OF THE DRAWINGS

The invention is now described in greater detail with reference to a preferred embodiment thereof, illustrated in the accompanying drawings and given only by way of non-limitative example, wherein.

DETAILED DESCRIPTION OF THE PREFERRED EMBODIMENTS

Figure 1:
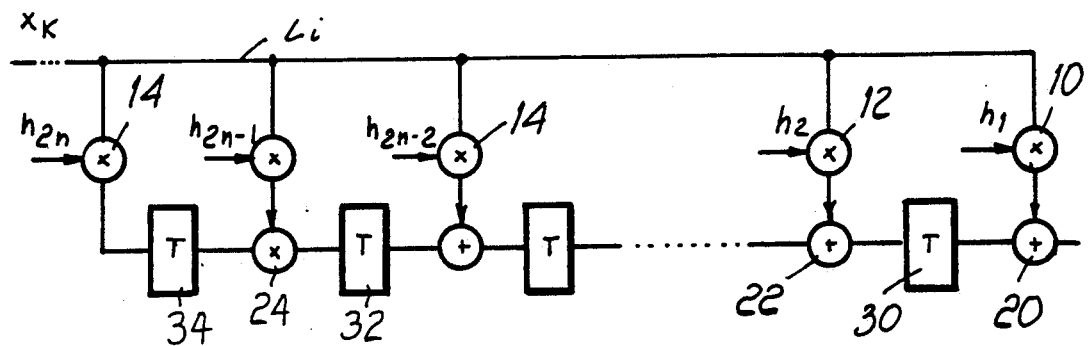
FIG. 1 is a conceptual block circuit diagram of a known programmable digital FIR filter.

FIG. 1 illustrates the block circuit diagram of a digital FIR filter according to one of a plurality of possible known canonical structures. The samples $x_k$ of the input signal are fed with the clock's timing on an input line L which is connected to respective first inputs of an array of multipliers 10, 12, . . . 14; respective i-th impulse response coefficients $h_1, h_2, \ldots h_{2n}$ are applied to the second inputs of said multipliers according to methods known to experts in digital filtering. The outputs $u_1, u_2, \ldots, u_n$ are applied to respective first inputs of an array of adders 20, 22, . . . , 24, and each adder (starting from the one of lowest characteristic) receives, on its second input, the output of the preceding adder across a respective delay element 30, 32, . . . , 34, all of which have the same delay T which is equal to a clock period. This structure is known as "transposed".

According to the invention, the known transposed-structure filter, as described above with reference to FIG. 1, is modified by replacing the multipliers 10, 12, . . . , 14 with respective memory banks 40, 42, ..., 44 which contain in tabular form the partial products $h_1 x_k$, $h_2 x_k$ etc. for all the possible levels of the input signal $x_k$. More precisely, x is used as read address of the memory bank, and the memory cells which has that address contains the appropriate partial product which is supplied on its output and is applied to the adder to which that bank leads.

In this manner the time required to generate each individual partial product is constant and independent from the characteristics of the operands, and is shorter than the time required by the multipliers used in the circuit of FIG. 1. The products can furthermore be provided with arbitrary precision, whereas any rounding or truncation is carried out only on the final result.

Though the memory banks 40, 42, ..., 44 can be of the RAM type, according to the invention the use of EPROM memories is preferred; said memories are less complicated and easier to integrate while allowing to program the filter.

The term "memory bank" as used in the present description and in the accompanying claims must be considered in a purely conceptual sense, i.e. the set of all the partial products related to a given coefficient $h_1$ constitutes a bank, the parallel output whereof is applied to a preset adder. However, taking into account that all the above mentioned banks receive, at each given instant, a same input signal (or line selection signal), according to the invention it is preferable that said banks actually form, from a physical point of view, a single memory with lines of cells constituted by as many bits as required for the total of the partial products and addressed, for the simultaneous readout of the entire line, by a single decoding block controlled by the signal to be filtered. In this unconventional memory, each bit cell leads to its own output amplifier which drives the input of the associated adder.

The term "memory bank" therefore means, in the context of the present invention, not just the bank in the conventional sense but also a group of cells which contain all the partial products of a given coefficient inside a memory of the above described kind.

Figure 2:
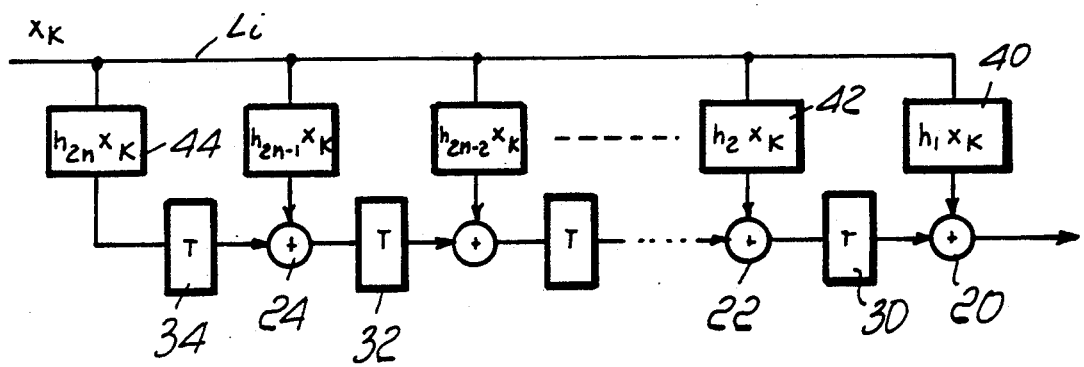
FIG. 2 is a conceptual block circuit diagram of a programmable digital FIR filter according to the invention.
Figure 3:
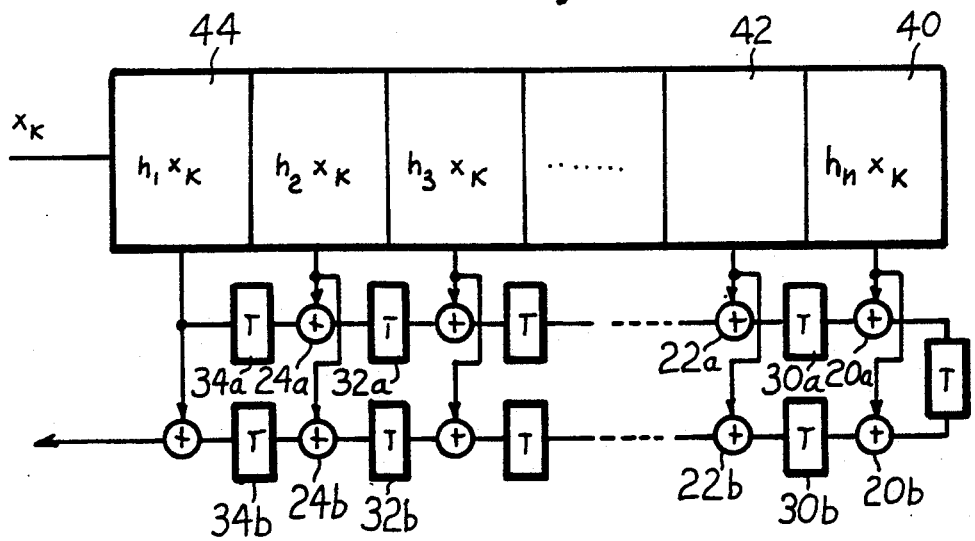
FIG. 3 is a diagram, similar to that of FIG. 2, which relates to a first preferred embodiment of the invention.

In a particularly advantageous embodiment of the invention, the structure of the FIR filter is even and symmetrical. In this manner, many of the partial products (as can be derived from digital filter theory) become equal to one another; this duplication, which has no practical consequence in a conventional filter with multipliers, allows the filter according to the invention to store in memory only the products which are different from one another (approximately half of the total products), providing the filter with a "folded" structure the block diagram whereof is illustrated in FIG. 3. As can be seen in said figure, the filter according to this improved embodiment is different from the one of FIG. 2 in that the chain of adders 20a, 20b, 22a, 22b, 24a and 24b and delay element 30a, 30b, 32b, 34a and 34b is folded and the output of each bank 40, 42, . . . , 44 is applied to two adders which are arranged symmetrically with respect to the central point of the chain.

Figure 4:
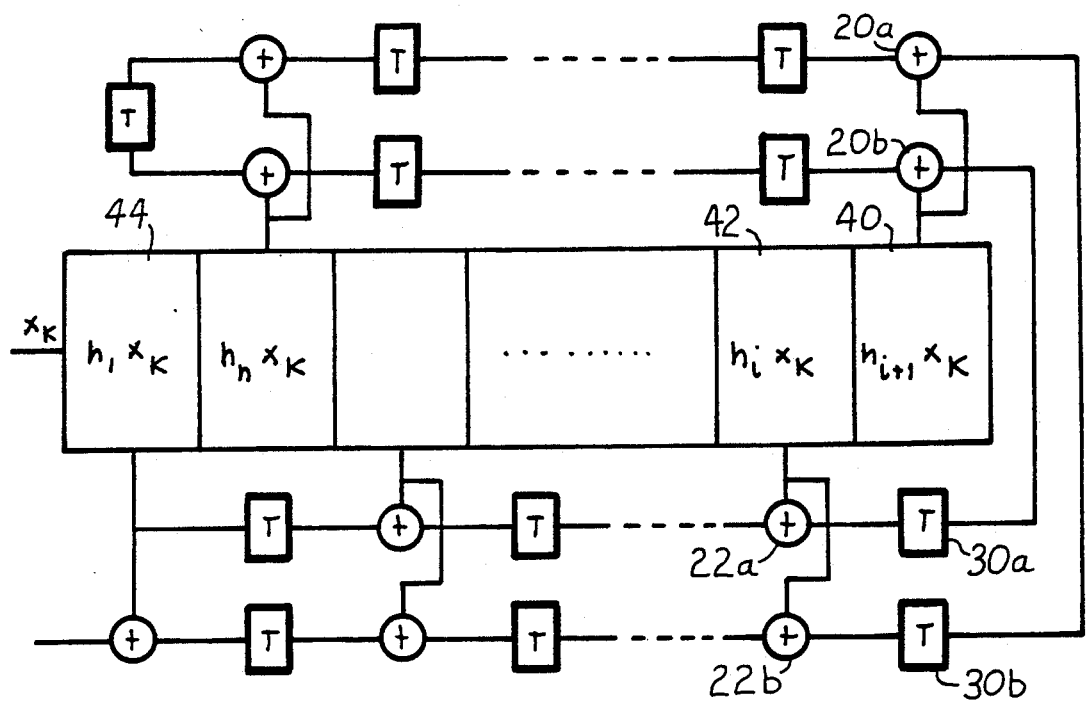
FIG. 4 is a circuit diagram of a filter according to a second preferred embodiment of the invention.

FIG. 4 illustrates a variated embodiment of the filter of FIG. 3, wherein the folded chain of adders is arranged on the two sides of the memory and the successive memory banks provide their outputs alternately on opposite sides. This arrangement allows to reduce the density of the memory's output amplifiers, making the filter's design less critical.

Figure 5:
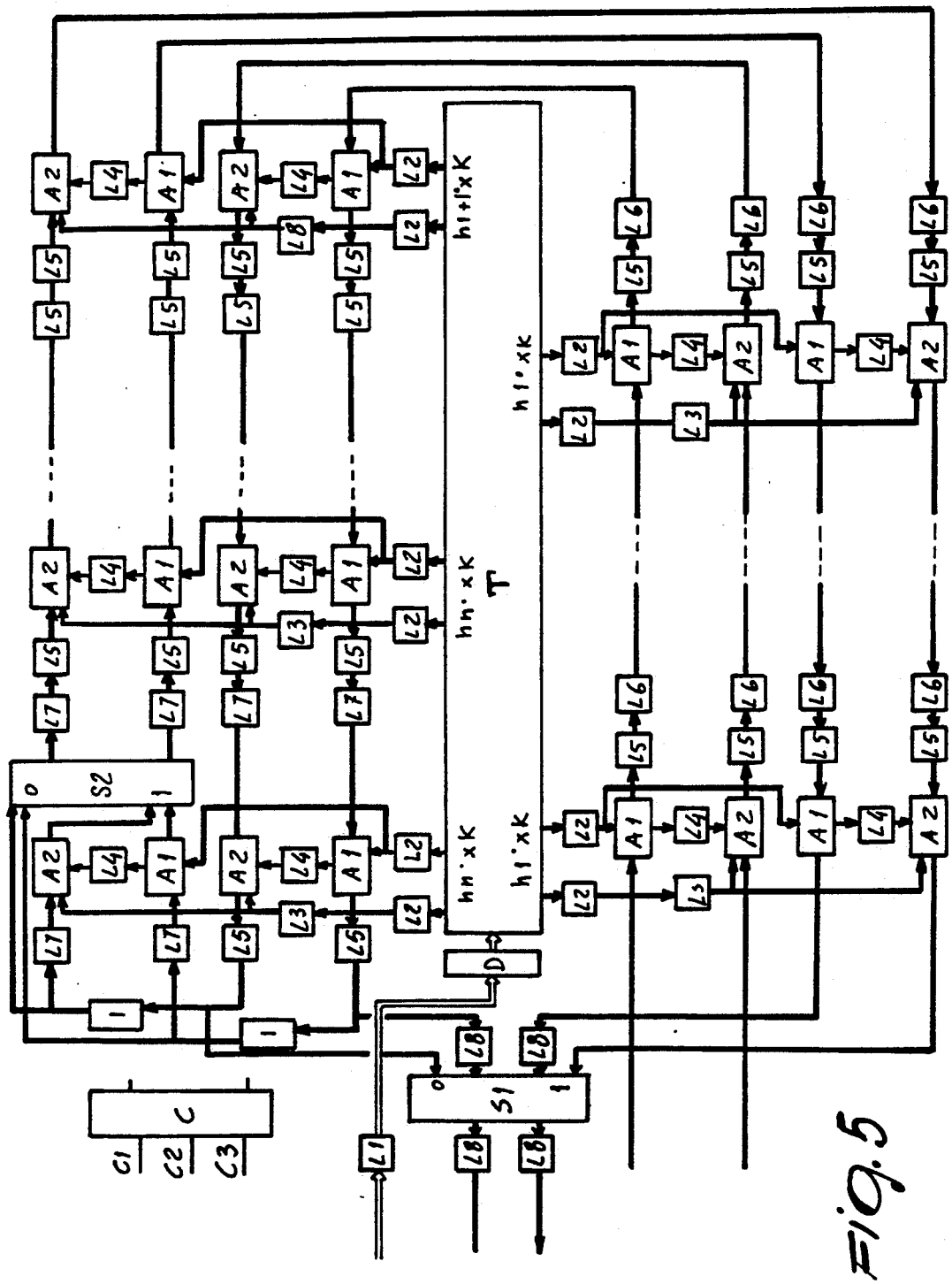
FIG. 5 is a detailed diagram of a filter according to a third preferred embodiment of the invention.

FIG. 5 is a more detailed illustration of the architecture of a filter organized according to FIG. 3. For reasons which will become apparent hereinafter, the parallel signals which propagate in the circuit of FIG. 5 are illustrated with a double line for complete buses, with a thick line for halved buses (i.e. buses comprising the most significant half or the least significant half of the bits which constitute the signal) and with a thin line for single wires.

In FIG. 5, T indicates the memory in which the table of partial products is stored; each line contains all the partial products related to a given level of the input signal to be processed. If m is the number of bits with which the signal to be processed is coded (for $2^m$ possible levels), n is the number of impulse-response coefficients, and $p_i$ is the precision with which the i-th partial product (which is variable according to the position of the related coefficient within the filter's impulse response) is represented, the table T will have m lines of $p_1+p_2+\ldots+p_n$ cells each. The block T also includes the n read amplifiers used for the simultaneous reading of the n partial products.

The output of a line decoder D is connected to the memory T; the input of said decoder receives the signal to be filtered across m registers L1 which have the purpose of synchronizing the front of the input signal with a required timing signal.

The outputs of the memory T are sent to pipeline registers L2 (the number whereof is $p_1+p_2+\ldots+p_n$) which have the purpose of making the speed requirements less critical. As is evident to the expert in the field, in this manner the reading of the table and the subsequent arithmetical processing occur in two different clock periods, increasing the times available for each of said operations, which become comparable to the clock period itself.

In order to make the filter practically executable on silicon without difficulty, the sums are implemented by decomposing the operation into two pipelined partial sums, each whereof operates on a different part of the word.

Two separate data flows, offset in time by a clock period, are thus generated: one corresponds to the LSBs (least significant bits), the other corresponds to the MSBs (most significant bits). Indicating with r the precision of the internal arithmetics adopted, each of said two flows of data comprises r/2 wires.

Figure 6:
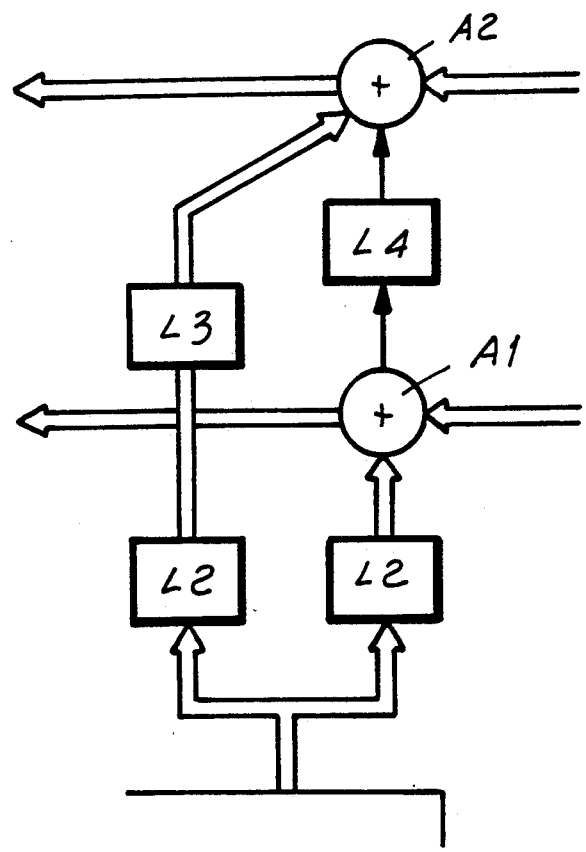
FIG. 6 is a more detailed block diagram of a parallel adder which is a part of the third embodiment of said filter.

Therefore, with reference now in particular to FIG. 6, the outputs of the pipeline registers L2 are sent to adders A1 of the kind with $w_2$ bit serial carry propagation, with $w_2=r/2$. The adders A1 operate on the least significant part of the datum. The outputs are also sent to adders A2 of the kind with r/2-bit serial carry propagation which operate on the most significant part of the datum (with precision $w_1$).

Before being processed, the word with lower precision (MSB) is brought to the same precision (r/2) as the other part of the word by sign expansion, in which, as is known in the field, the sign bit is replicated $w_2-w_1$ times. As regards the first adder stage, the adders A1 and A2 would not be necessary, but they are nonetheless used to allow the serialization of a plurality of base modules by virtue of an optional input (carry input) which is used in the production of two-dimensional filters.

Registers L3 are arranged in cascade at the outputs of the pipeline registers L2 which lead to the adders A2 ($w_1$ most significant bits) and have the purpose of introducing a time offset of the most significant part of each word ($h_1 x_k$) which exits from the table.

The carries generated by the adders A1 are memorized in respective registers L4 in the step of adding the least significant part of the datum. The carries are provided to the adders A2 in the successive clock period for the step of adding the most significant part of the datum.

Pipeline registers L5 are arranged between each pair of adders A1 and A2 which belong to adjacent adder stages (r registers are provided for each stage), as imposed by the transposed structure assumed as reference.

The circuit of FIG. 5 finally comprises output registers L8 (r/2 registers are provided) for the resynchronization of the two data flows LSB and MSB.

Besides the elements described above, the filter according to the embodiment of FIG. 5 advantageously furthermore comprises a set of optional components which have the purpose of allowing the implementing of half-band FIR filterings. As is known to the expert in the field, half-band FIR filters are filters which have even symmetrical impulse responses with an odd number of coefficients (with a central coefficient) and with coefficients $h_k$ which are nil when k is odd except for $h_0$ and a frequency response with 6 dB of attenuation at the Nyquist frequency. A half-band filter therefore requires approximately half the number of arithmetical operations with respect to a symmetrical FIR of equal length.

The circuit of FIG. 5 therefore also comprises registers L6 inserted between each pair of adders A1 and A2 which belong to adjacent adder stages except between those corresponding to the first two coefficients which are adjacent to the central one and the one corresponding to the central one. Said registers can be selected by means of external static control signals C1, C2 and C3 which drive a logical unit C for generating the internal control signals in relation to the different combinations of the three static signals C1, C2 and C3.

The addition of the registers L6 is equivalent to the introduction of a new stage (relative to the nil coefficient) between each pair of pre-existing stages), the adder whereof is omitted since the datum at one of its inputs is always nil. The memorization of said product is thus also avoided. For this reason, the additional register is inserted only in the points of the arithmetical chain where the term corresponding to the nil coefficient is to be inserted.

In this manner, half-band filterings up to a maximum length of $4(n-2)+3$ are possible.

Other registers L7 (similar to the registers L6) are arranged between each pair of adders A1 and A2 which belong to adjacent adder stages; said registers can also be selected externally with C1, C2 and C3 together with the registers L6 to implement impulse responses with zeros interleaved at each pair of coefficients in order to provide extended-length symmetrical filterings.

The folded structure allows the following maximum filtering lengths (for symmetrical filterings):
$2n$ : if there is no central coefficient;
$2n-1$ : if there is a central coefficient.

In order to provide symmetrical or asymmetrical filterings within the scope of the above described operating modes, the circuit furthermore comprises a first switch S1 controlled by the signals C1, C2 and C3 which allows to select the symmetrical output or the asymmetrical output. The symmetrical output corresponds to the output of the folded arithmetical chain (output of the $2 \times n$-th adder) and is used to implement symmetrical filterings, whereas the asymmetrical output allows to split the arithmetical chain and use only one branch thereof (output of the n-th adder) and is used to implement asymmetrical filterings.

Another switch S2, also controlled by the signals C1, C2 and C3, allows to skip the $n+1$-th adder stage in the implementation of symmetrical filterings with an odd number of coefficients (with a central coefficient).

Finally, a one-complementing unit, in the form of $r/2$ inverters, is arranged between the n-th and the $n+1$-th adder stage and can also be selected by means of the static control signals C1, C2 and C3. This unit provides odd symmetrical responses as follows. Symmetry is preserved as regards the absolute values of the partial products. Sign reversal between the two parts of the impulse response is provided on the partial datum at the folding point of the arithmetical chain by using the complementation and forcing to one the carry-in of the adder A1 of the successive stage (thus providing, as is evident to the expert in the field, a two's complementation). In this case, the partial products in the table must furthermore be stored with an opposite sign with respect to the (temporally) first $n/2$ impulse-response coefficients.

The individual functional options which can be obtained with the different configurations are listed in the following table:

| No. | Characteristics | L6 | L7 | I | S1 | S2 |
|---|---|---|---|---|---|---|
| 1 | Symmetrical, even, with central coefficient | no | no | no | 1 | 0 |
| 2 | Symmetrical, even, without central coefficient | no | no | no | 1 | 1 |
| 3 | Half-band | yes | no | no | 1 | 0 |
| 4 | Symmetrical, odd | no | no | yes | 1 | 1 |
| 2 | Symmetrical, even, without central coefficient | no | no | no | 1 | 1 |
| 3 | Half-band | yes | no | no | 1 | 0 |
| 4 | Symmetrical, odd | no | no | yes | 1 | 1 |
| 5 | Asymmetrical | no | no | no | 0 | — |
| 6 | Symmetrical, even, with central coefficient and interleaved zeros | yes | yes | no | 1 | 0 |
| 7 | Symmetrical, even, without central coefficient and interleaved zeros | yes | yes | no | 1 | 1 |

Preferred embodiments of the invention have been described, but it is understood that, on the basis of the teachings provided, the expert in the field can easily devise modifications and variations which are functionally equivalent and are therefore within the scope of the invention concept as defined in the accompanying claims.

We claim:

1. Programmable digital filter comprising:
   a) a plurality of parallel adders, each parallel adder having a first input, a second input and a parallel output, the parallel output of each said parallel adder being connected to said first input of the successive adder across a respective delay element, and a memory comprising:
   b) a memory bank including a plurality of addressable memory cells, wherein each memory cell holds a partial product of a preset coefficient and substantially all partial products held in said memory bank are non-redundant with other partial products held therein, said memory bank having an addressing input connected to a sampled digital signal to be filtered and a substantial number of outputs of said cells are connected to second inputs of at least two parallel adders, said memory bank comprising a number of bit lines not smaller than the total number of levels assumed by said sampled digital signal to be filtered, and a number of bits per line which is not smaller than the total number of bits of the partial products of present coefficients and given level of said sampled digital signal, said memory bank including a unit for decoding said sampled digital signal.

2. Digital filter according to claim 1, characterized in that said memory bank is of the EPROM type.

3. Digital filter according to claim 1, characterized in that each of said parallel adders is constituted by a first half-adder which has a first input, a second input, a carry output and a signal output, the least significant half of the bit of the signal in output from the corresponding memory bank being applied to the second input of said first half-adder, and by a second half-adder having a first input, a second input a carry-over input and a signal output, the most significant half of the bits of said signal in output from the corresponding memory bank being applied to the second input of said second half-adder through a first delay element, the carry output of said first half-adder being connected to said carry input of said second half-adder across a second delay element, the outputs of said first half-adder and of said second half-adder being applied separately to the first inputs of said first half-adder and of said second half-adder of the successive adder stage.

4. Digital filter according to claim 1, further including a read amplifier for each bit line.

5. Digital filter according to claim 4, characterized in that the output of said memory bank is connected to the second inputs of a respective pair of said adders which are symmetrical to a central point of the plurality of parallel adders.

6. Digital filter according to claim 5, said memory further comprising additional memory banks wherein the read amplifiers of said memory for successive banks are arranged on opposite sides of the longitudinal direction of the memory, and said adders extend on the two longitudinal sides of said memory.

7. Digital filter according to claim 4, further comprising first selectable registers inserted between each pair of adders which belongs to adjacent adder stages except between those corresponding to the first two coefficients which are adjacent to an adder stage that is centrally located in the plurality of adders and the centrally located adder stage itself.

8. Digital filter according to claim 4, further comprising second selectable registers inserted between each pair of adders which belongs to adjacent adder stages.

9. Digital filter according to claim 4, further comprising a first selectable switch adapted to take the output signal from the last adder stage of the chain of adders or from the central point of said chain.

10. Digital filter according to claim 4, further comprising a second selectable switch adapted to take the output signal from a last adder stage in the plurality of adders or from a second to last adder stage.

11. Digital filter according to claim 4, further comprising selectable signal-complementing means arranged between the n-th and the n+1-th adder stage of said plurality of adders, and in that the partial products of the second half of the coefficients are memorized in the memory banks with the opposite sign with respect to that of the first half of the coefficients.

* * * * *